(12) United States Patent
Kondo

(10) Patent No.: US 10,717,889 B2
(45) Date of Patent: Jul. 21, 2020

(54) CONDUCTOR COMPOSITION INK, CONDUCTOR, LAMINATE, LAMINATED WIRING BOARD AND ELECTRONIC EQUIPMENT

(71) Applicant: IDEMITSU KOSAN CO., LTD., Tokyo (JP)

(72) Inventor: Hirofumi Kondo, Chiba (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 376 days.

(21) Appl. No.: 15/321,871

(22) PCT Filed: Jun. 24, 2015

(86) PCT No.: PCT/JP2015/068135
§ 371 (c)(1),
(2) Date: Dec. 23, 2016

(87) PCT Pub. No.: WO2015/199112
PCT Pub. Date: Dec. 30, 2015

(65) Prior Publication Data
US 2017/0130085 A1   May 11, 2017

(30) Foreign Application Priority Data
Jun. 24, 2014   (JP) .................. 2014-128998

(51) Int. Cl.
| *C09D 11/52* | (2014.01) |
| *C09D 11/03* | (2014.01) |
| *C09D 11/38* | (2014.01) |
| *H05K 1/09* | (2006.01) |
| *H01B 1/22* | (2006.01) |

(Continued)

(52) U.S. Cl.
CPC .............. *C09D 11/52* (2013.01); *C09D 11/03* (2013.01); *C09D 11/033* (2013.01); *C09D 11/037* (2013.01); *C09D 11/322* (2013.01); *C09D 11/38* (2013.01); *H01B 1/22* (2013.01); *H05K 1/092* (2013.01); *H05K 2201/0203* (2013.01); *H05K 2203/122* (2013.01)

(58) Field of Classification Search
None
See application file for complete search history.

(56) References Cited

U.S. PATENT DOCUMENTS

| 10,026,624 B2* | 7/2018 | Kurihara | H01L 21/486 |
| 2002/0005507 A1* | 1/2002 | Matsumoto | H01B 1/16 |
| | | | 252/500 |
| 2010/0276302 A1* | 11/2010 | Raguse | G01N 27/127 |
| | | | 205/775 |

FOREIGN PATENT DOCUMENTS

| JP | 2012-204658 A | 10/2012 |
| JP | 2012-256802 A | 12/2012 |

(Continued)

OTHER PUBLICATIONS

Tano—JP 2013-120624A, Machine Translation (Year: 2013).*

(Continued)

*Primary Examiner* — Callie E Shosho
*Assistant Examiner* — Patrick N English
(74) *Attorney, Agent, or Firm* — Millen White Zelano and Branigan, PC; John Sopp

(57) ABSTRACT

A conductor composition ink of the invention includes: (A) a fluorine-containing compound to form a self-assembled monomolecular film; (B) metal particles; and (C) a solvent.

17 Claims, 6 Drawing Sheets

Figure 1:
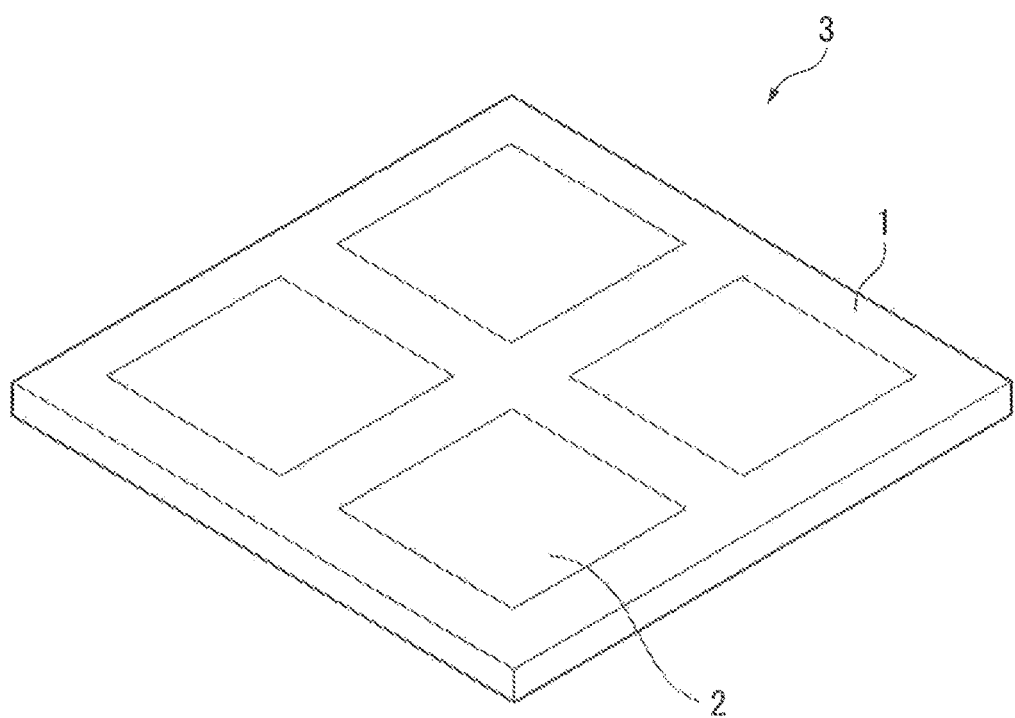

(51) Int. Cl.
    *C09D 11/037*     (2014.01)
    *C09D 11/033*     (2014.01)
    *C09D 11/322*     (2014.01)

(56) References Cited

FOREIGN PATENT DOCUMENTS

| | | |
|---|---|---|
| JP | 5145687 B | 2/2013 |
| JP | 2013-120624 A | 6/2013 |
| JP | 2013120624 A * | 6/2013 |

OTHER PUBLICATIONS

Surface Tension DE, Surface tension values, Feb. 25, 2017, pp. 1-5, http://www.surface-tension.de/ Year: 2017)*

International Search Report dated Sep. 15, 2015 issued in corresponding PCT/JP2015/068135, 2 pages.
Tang, W. et al., "Controlling the surface wettability of the polymer dielectric for improved resolution of inkjet-printed electrodes and patterned channel regions in low-voltage solution-processed organic thin film transistors", Journal of Materials Chemistry C, 2014, vol. 2, pp. 5553-5558.
English translation ABSTRACT of JP2013-120624A published Jun. 17, 2013 (1 page).
English translation ABSTRACT of JP2012-204658A published Oct. 22, 2012 (1 page).
English translation ABSTRACT of JP2012-256802A published Dec. 27, 2012 (1 page).
English translation ABSTRACT of JP5145687A published Feb. 20, 2013 (1 page).
International Preliminary Report on Patentability (IPRP) dated Dec. 27, 2016 issued in corresponding PCT/JP2015/068135 application (5 pages).

* cited by examiner

CONDUCTOR COMPOSITION INK, CONDUCTOR, LAMINATE, LAMINATED WIRING BOARD AND ELECTRONIC EQUIPMENT

TECHNICAL FIELD

The present invention relates to a conductor composition ink used for forming a VIA, and a conductor, a laminate, a laminated wiring board and electronic equipment using the conductor composition ink.

BACKGROUND ART

Recently, it has been considered to form a transistor array including a plurality of organic thin-film transistors (organic TFT) on a plastic board by a low-cost process and apply the transistor array to a backplane for an electronic paper, a liquid crystal display and the like. In a manufacturing method of the organic thin-film transistors, in order to differentiate the thin-film transistors from a typical silicon TFT, it is strongly desired that configuration components are formed in a pattern at a low cost only by a printing process without performing a vacuum process and a photolithography technique.

In such a background, a method of forming by printing a VIA for electrically connecting conductors such as the transistor array and the wiring pattern has been considered. For instance, a method has been proposed including: forming an insulative film on a board in a manner to cover a wiring pattern provided on the board; repeating ejecting a solvent for dissolving the insulative film toward the insulative film on the wiring pattern by inkjet printing and drying the solvent, thereby forming a VIA hole reaching the wiring pattern; and filling the VIA hole with an conductive material (see, for instance, Patent Literature 1). Moreover, a method of forming a VIA in an especial shape by inkjet printing directly on a wiring pattern provided on a board has been proposed (see, for instance, Patent Literature 2).

CITATION LIST

Patent Literature(s)

Patent Literature 1: JP-A-2012-204658
Patent Literature 2: Specification of Japanese Patent No. 5145687

SUMMARY OF THE INVENTION

Problem(s) to be Solved by the Invention

However, in the method disclosed in Patent Literature 1, since the frequent ejecting of the solvent onto the same point on the insulative film and the drying of the solvent are repeated in order to clearly make the VIA hole, it adversely takes times. Moreover, when the VIA is formed by this method, a diameter of the VIA is difficult to accurately control although being controllable to some extent by controlling a volume and a discharge frequency of the solvent.

In the method disclosed in Patent Literature 2, since a projecting periphery of a conductive portion is used, an available conductive area is diminished as the formed conductive portion becomes small.

Further, in these methods, only a step for forming the VIA in a printing process is devised, but the printing process is still complicated and has a large number of steps, resulting in a decrease of a yield in production.

Accordingly, an object of the invention is to provide a conductor composition ink capable of forming a VIA for electrically connecting conductors such as a wiring pattern through an insulative film, and a conductor, a laminate, a laminated wiring board and electronic equipment using the conductor composition ink.

Means for Solving the Problem(s)

In order to solve the above problem, the invention provides a conductor composition ink, and a conductor, a laminate, a laminated wiring board and electronic equipment using the conductor composition ink, as described below.

According to an aspect of the invention, a conductor composition ink includes: (A) a fluorine-containing compound to form a self-assembled monomolecular film; (B) metal particles; and (C) a solvent.

In the above arrangement, the component (A) is preferably a fluorine-containing thiol compound.

In the above arrangement, the conductor composition ink in a form of a dried and solidified film preferably has a surface energy of 30 mN/m or less.

In the above arrangement, the component (B) preferably has a self-assembled monomolecular film thereon formed from the component (A).

In the above arrangement, the solidified film preferably has a surface energy in a range from 20 mN/m to 28 mN/m.

In the above arrangement, the component (A) preferably has a content of 10 mass % or less of a total amount of the conductor composition ink.

In the above arrangement, the component (A) is preferably at least one compound selected from the group consisting of a fluorine-containing thiol compound having an aromatic ring and alkanethiol having a fluorinated moiety.

In the above arrangement, the component (A) is preferably a fluorine-containing thiol compound having an aromatic ring and 6 to 20 carbon atoms.

In the above arrangement, the component (A) is preferably at least one compound selected from the group consisting of 4-trifluoromethylbenzenethiol, 3-trifluoromethylbenzenethiol, pentafluorobenzenethiol, 2,3,5,6-tetrafluorobenzenethiol, 2,3,5,6-tetrafluoro4-(trifluoromethyl)benzenethiol, 2,3,5,6-tetrafluoro-4-mercapto benzoic acid methylester, 3,5-bistrifluoromethylbenzenethiol, 4-fluorobenzenethiol, and 11-(2,3,4,5,6-pentafluorobenzyloxy)-1-undecanethiol.

In the above arrangement, the component (B) preferably has a content in a range from 15 mass % to 75 mass % of the total amount of the conductor composition ink.

In the above arrangement, the component (B) preferably includes at least one metal species selected from the group consisting of silver, copper, nickel, palladium, platinum, and gold.

In the above arrangement, the metal species of the component (B) is preferably silver.

In the above arrangement, the component (C) preferably has a content in a range from 25 mass % to 85 mass % of the total amount of the conductor composition ink.

In the above arrangement, the component (C) is preferably a diol solvent having a surface tension in a range from 40 mN/m to 65 mN/m.

In the above arrangement, the component (C) is preferably at least one selected from the group consisting of ethylene glycol, glycerin and 1,3-propanediol.

According to another aspect of the invention, a conductor includes: (A) a fluorine-containing compound to form a self-assembled monomolecular film; and (B) metal particles.

In the above arrangement, the component (A) is preferably a fluorine-containing thiol compound.

In the above arrangement, the component (B) preferably has a self-assembled monomolecular film thereon formed from the component (A).

According to still another aspect of the invention, a laminate includes: a board; an electrode provided on the board; and a conductor formed on the electrode, comprising: (A) a fluorine-containing compound to form a self-assembled monomolecular film; and (B) metal particles.

In the above arrangement, the laminate preferably further includes an insulative film that is formed on the board, the electrode and the conductor without covering an upper side of the conductor.

In the above arrangement, the laminate preferably further includes a conductive film that is formed on the insulative film and is in contact with the upper side of the conductor.

In the above arrangement, the component (A) is preferably a fluorine-containing thiol compound.

In the above arrangement, the component (B) preferably has a self-assembled monomolecular film thereon formed from the component (A).

According to a further aspect of the invention, a laminated wiring board includes the laminate according to the above aspect of the invention.

According to a still further aspect of the invention, electronic equipment includes the laminated wiring board according to the above aspect of the invention.

According to the above aspects of the invention, a conductor composition ink capable of forming a VIA for electrically connecting conductors such as a wiring pattern through an insulative film can be provided.

BRIEF DESCRIPTION OF DRAWING(S)

FIG. 1 schematically shows a wiring pattern-provided board (array) before forming a VIA in an exemplary embodiment of the invention.

Figure 2:
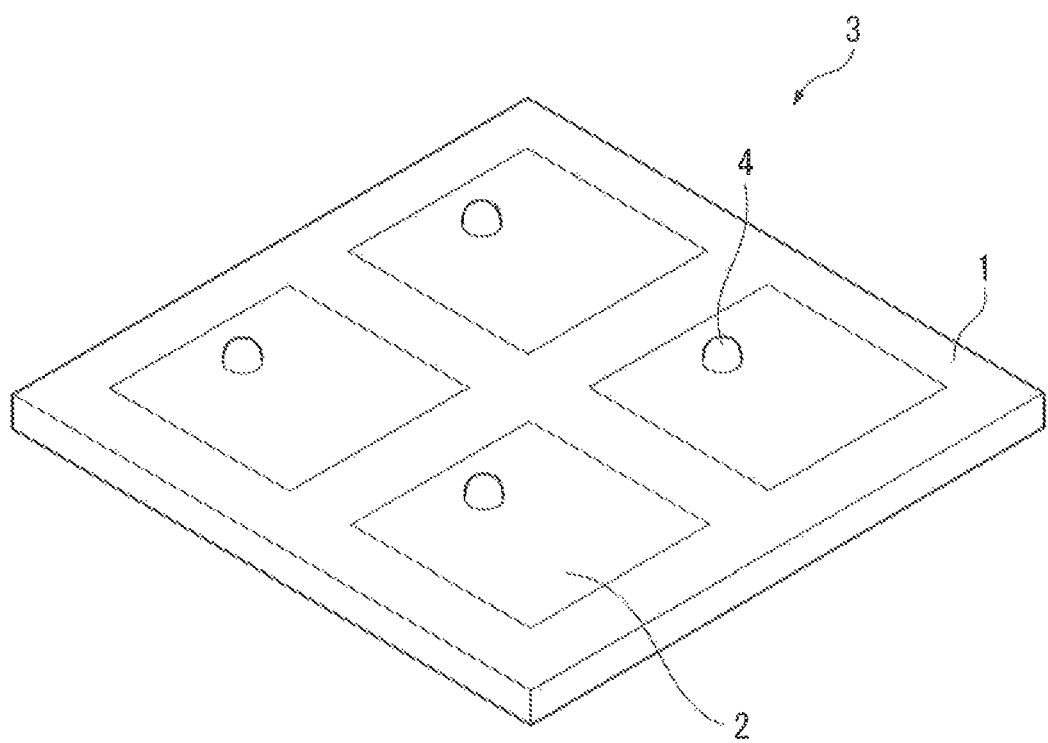

FIG. 2 schematically shows the array after forming the VIA in the exemplary embodiment of the invention.

Figure 3:
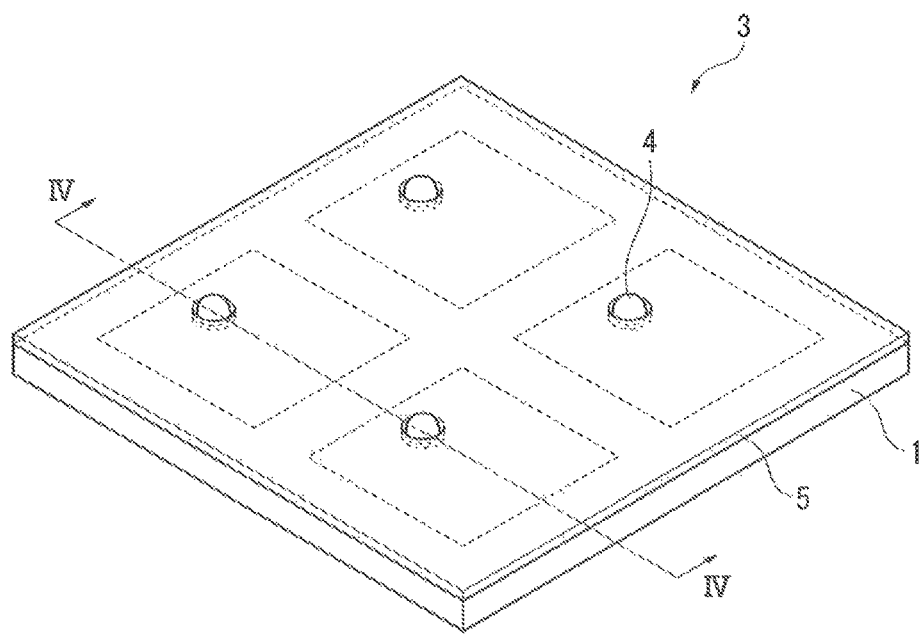

FIG. 3 schematically shows the array after forming an insulative film in the exemplary embodiment of the invention.

Figure 4:
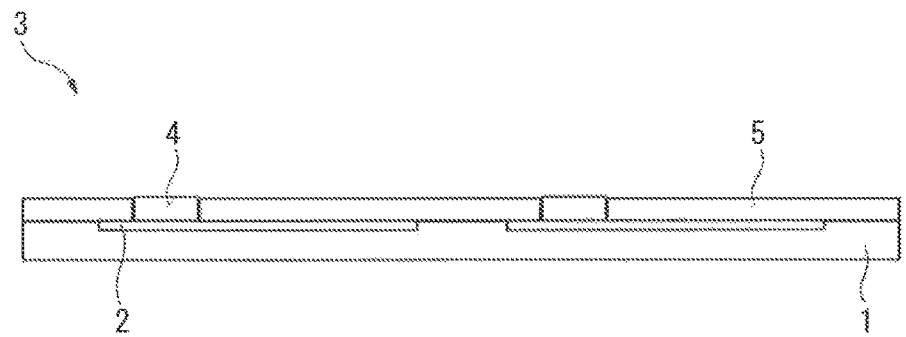

FIG. 4 shows a cross section taken along a IV-IV line in FIG. 3.

Figure 5:
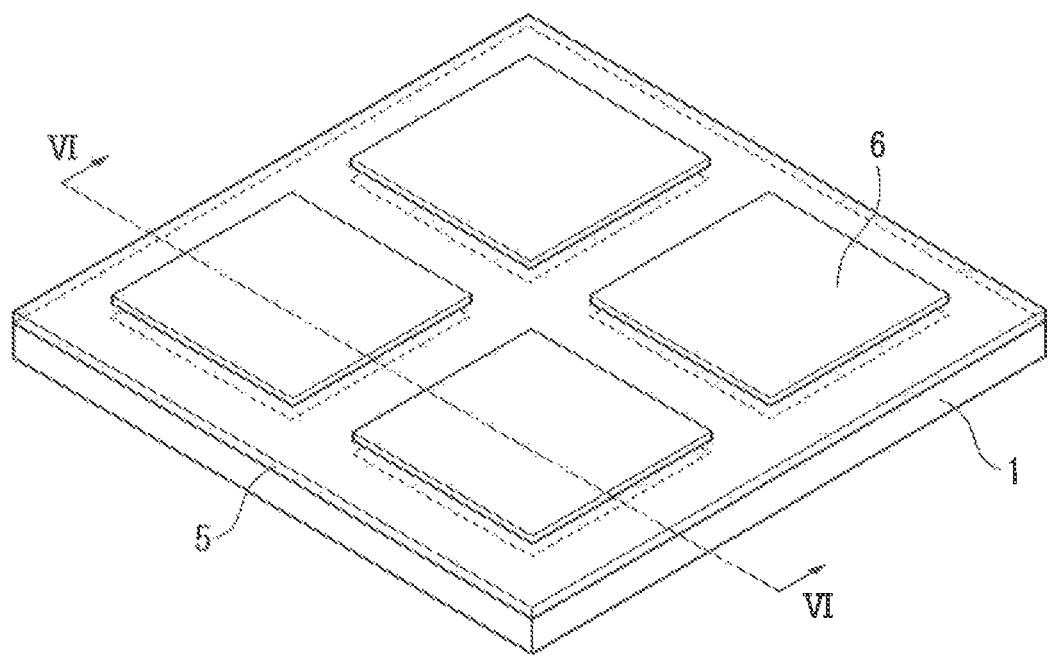

FIG. 5 schematically shows the array after forming a conductive film in the exemplary embodiment of the invention.

Figure 6:
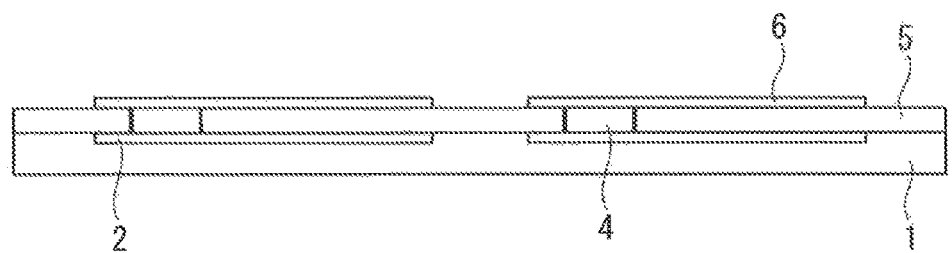

FIG. 6 shows a cross section taken along a VI-VI line in FIG. 5.

DESCRIPTION OF EMBODIMENT(S)

Conductor Composition Ink

Firstly, a conductor composition ink according to the exemplary embodiment of the invention will be described.

A conductor composition ink according to the exemplary embodiment of the invention (hereinafter, also referred to as "the present ink") contains: (A) a fluorine-containing compound to form a self-assembled monomolecular film; (B) metal particles; and (C) a solvent, which are described later.

The present ink in a form of a dried and solidified film preferably has a surface energy of 30 mN/m or less. When the surface energy exceeds 30 mN/m, liquid repellency tends to be lowered. Accordingly, when the present ink is used for forming a VIA for electrically connecting conductors, the present ink adheres on the laminated insulative film to be unable to self-assemble the VIA. In consideration of using an insulative film having a lower surface energy and preventing the present ink from spreading over a conductor (undercoat) in order to improve uniformity of the formed film, the surface energy of the solidified film of the present ink is particularly preferably in a range from 20 mN/m to 28 mN/m. The surface energy can be measured by a contact angle measuring method.

Adjustment of the surface energy of the present ink is exemplified by adjustment of a kind and a content of the component (A).

Component (A)

The component (A) in the present ink is a fluorine-containing compound to form a self-assembled monomolecular film. Containing of the component (A) can provide liquid repellency to metal particles of the component (B) while ensuring electrical conductivity between the metal particles. As a result, a printed matter obtained by using the present ink can exhibit both of conductivity and liquid repellency. The component (A) is preferably a fluorine-containing thiol compound. Moreover, the component (A) may be present while modifying the surface of the metal particles in the present ink. At this time, a group (e.g., a thiol group) of the component (A), which modifies the surface of the metal particles, may react with the surface of the metal particles.

Examples of a fluorine-containing thiol compound of the component (A) to form a self-assembled monomolecular film include a fluorine-containing thiol compound having an aromatic ring and alkanethiol having a fluorinated moiety. Among the above examples, at least one compound selected from the group consisting of a fluorine-containing thiol compound having an aromatic ring (preferably a benzene ring) and 6 to 20 carbon atoms is preferable in terms of surface modification of the metal particles.

Specific examples of the fluorine-containing thiol compound having an aromatic ring and 6 to 20 carbon atoms include 4-trifluoromethylbenzenethiol, 3-trifluoromethylbenzenethiol, pentafluorobenzenethiol, 2,3,5,6-tetrafluorobenzenethiol, 2,3,5,6-tetrafluoro-4-(trifluoromethyl)benzenethiol, 2,3,5,6-tetrafluoro-4-mercapto benzoic acid methylester, 3,5-bistrifluoromethylbenzenethiol, 4-fluorobenzenethiol, and 11-(2,3,4,5,6-pentafluorobenzyloxy)-1-undecanethiol (a formula below).

Among the above examples, trifluoromethylbenzenethiol and/or 2,3,5,6-tetrafluoro-4-(trifluoromethyl)benzenethiol are particularly preferable in terms of liquid repellency.

Formula 1

The component (A) preferably has a content of 10 mass % or less of a total amount of the ink, more preferably 5 mass % or less. When the content of the component (A) is equal to or less than the upper limit, dispersion performance of the metal particles in the ink is not hampered. Moreover, the lower limit is preferably 0.1 mass % or more in terms of liquid repellency of the printed matter obtained by using the present ink.

Component (B)

The component (B) in the present ink is metal particles. The component (B) is a starting material for expressing conductivity after the present ink is printed and dried to be solidified. Moreover, it is preferable that the component (B) has a self-assembled monomolecular film thereon formed from the component (A).

Examples of metal species of the component (B) include silver, copper, nickel, palladium, platinum, and gold. One of the examples may be used alone or two or more thereof may be used in combination. Among the examples, silver is particularly preferable in terms of affinity with the component (A). The component (B) preferably has an average particle diameter in a range from 10 nm to 1000 nm. Moreover, a metallic nano-wire having a diameter of 50 nm or less may be included. A particle diameter of the metal particles can be measured by observing using a transmission electron microscope (TEM). Specifically, a measurement method of the particle diameter includes measuring projected area circle-equivalent diameters of all the particles (about 50 pieces) in a field of view, and calculating an average of the obtained diameters.

The component (B) preferably has a content in a range from 15 mass % to 75 mass % of the total amount of the ink, more preferably in a range from 20 mass % to 50 mass %. When the content of the component (B) falls within the above range, a conductive VIA can be more efficiently formed.

Component (C)

The component (C) in the present ink is a solvent.

Examples of the solvent of the component (C) include water, an alcohol solvent (monoalcohol solvent, diol solvent, polyhydric alcohol solvent), hydrocarbon solvent, ketone solvent, ester solvent, ether solvent, glyme solvent, and halogen solvent. One of the examples may be used alone or two or more thereof may be used in combination. Among the examples, the diol solvent is preferable in terms of printability. The component (C) preferably has a surface tension in a range from 40 mN/m to 65 mN/m. When the surface tension of the component (C) falls within the above range, the present ink in use for formation of a VIA can sufficiently adhere on an undercoat. The surface tension can be measured by a pendant drop method.

Examples of the diol solvent having the surface tension in a range from 40 mN/m to 65 mN/m include ethylene glycol, glycerin and 1,3-propanediol. Among the examples, ethylene glycol is particularly preferable.

The component (C) preferably has a content in a range from 25 mass % to 85 mass % of the total amount of the ink, more preferably in a range from 50 mass % to 80 mass %. When the content of the component (C) falls within the above range, the present ink can be suitably coated.

Other Component(s)

The conductor composition ink according to the exemplary embodiment of the invention may include any component in addition to the components (A) to (C).

The any component is exemplified by a dispersant.

The any component preferably has a content of 10 mass % or less of the total amount of the ink.

Manufacturing Method of Conductor Composition Ink

The conductor composition ink according to the exemplary embodiment of the invention can be manufactured, for instance, by mixing the above components. A mixing method is not particularly limited and exemplified by a method of mixing with a mixer such as a mechanical stirrer, magnetic stirrer, ultrasonic disperser, planetary mill, ball mill and triple roll mill.

The printed matter obtained by using the conductor composition ink according to the exemplary embodiment of the invention has both of conductivity and liquid repellency and can be suitably used as an ink for forming a VIA for electrically connecting conductors on a wiring pattern.

VIA Forming Method

An example of a method of forming a VIA using the conductor composition ink according to the exemplary embodiment of the invention will be described below with reference to the attached drawings.

FIGS. 1 to 6 show the example of the method of forming the VIA using the conductor composition ink according to the exemplary embodiment of the invention.

Firstly, as shown in FIG. 1, a wiring pattern 2 of a metal electrode is provided by a known method on a board 1 to manufacture an array 3. Examples of the board include a glass board and a plastic film (e.g., polyethylene terephthalate (PET), polyethersulfone (PES), and polycarbonate (PC)). A material for the metal electrode is not particularly limited as long as the material has conductivity. Any known material can be used. For instance, the same material as the material for the metal electrode can be used.

Next, as shown in FIG. 2, the conductor composition ink according to the exemplary embodiment of the invention is coated at a desired position on a surface of the wiring pattern 2, thereby forming the VIA 4. Examples of the coating method of the ink include an inkjet printing and a screen printing. The inkjet printing capable of a flexible alignment is preferable. According to the inkjet printing, a diameter of the VIA 4 is approximately the same as the diameter of the VIA 4 formed by coating the conductor composition ink. Accordingly, the diameter of the VIA 4 can be easily controlled to a desired value by adjusting a coating amount and the like of the ink. For instance, the VIA 4 is formed to have the diameter in a range from 20 μm to 200 μm.

Next, as shown in FIG. 3, an insulative film 5 is formed by spin coating and the like using an insulative material on the array 3 after the VIA 4 is formed. The insulative material is not particularly limited as long as the material has electrical insulation and can be formed into a thin film. Any known material can be used.

At this time, sine the VIA 4 repels the insulative material because of liquid repellency of the present ink, an upper side of the VIA 4 is not covered with the insulative film 5 (see FIG. 4). Accordingly, the VIA 4 configured to electrically connect the wiring pattern 2 and a later-described conductive film 6 can be self-assembled.

As shown in FIG. 5, the conductive film 6 is formed by screen printing and the like using a conductive material on the array 3 after the insulative film 5 is formed. By this step, the conductive film 6 is in contact with the upper side of the VIA 4 as shown in FIG. 6, so that the wiring pattern 2 is electrically connected with the conductive film 6 to enable extraction of the electrode. A material for the conductive material is not particularly limited as long as the material has conductivity. Any known material can be used. For instance, the same material as the material for the metal electrode can be used.

The printed matter obtained by using the conductor composition ink according to the exemplary embodiment of the invention ink has conductivity and liquid repellency. Accordingly, as described above, when the insulative material is coated in the subsequent step after the VIA is formed using the present ink, the VIA repels the insulative material to enable self-assembly of the VIA. As a result, a patterning of an interlayer insulative film becomes unnecessary, so that the steps for forming the VIA can be considerably reduced to improve productivity of the VIA. Moreover, since the VIA can be formed by the inkjet printing, the formation of the VIA can be accurate.

Usage

The above forming method of the VIA is applicable to a manufacturing method of a device (laminate) including a VIA (conductor) and two electrodes configured to be electrically connected to each other through the VIA. Examples of the device (laminate) include a semiconductor device, touch panel sensor, RF-ID (Radio Frequency Identification), organic electroluminescence device, and laminated wiring board (flexible printed circuits (FPC), rigid printed board).

The above laminated wiring board is usable for electronic equipment such as a liquid crystal display, television set, car navigation system, mobile phone, gaming hardware, digital camera, personal computer and printer.

EXAMPLES

Next, the invention will be described more in detail by Examples below, however, is by no means limited to the Examples.

Example 1

First, a wiring pattern using a silver electrode was provided on a glass board by reverse printing to form an array.

Next, a conductor composition ink was printed at a desired point on a surface of the wiring pattern by inkjet printing to form a VIA, the conductor composition ink being a mixture of silver nano-colloids (average particle diameter: 40 nm), trifluoromethylbenzenethiol and ethyleneglycol at a mass ratio of 15:5:80. The VIA had a diameter of 40 μm and a height of 480 nm. As a result of a measurement using a probe-type step profiler, the VIA had a cross section having a substantially flat upper surface although having a gentle convex at the center of the upper surface.

Subsequently, by spin coating using ANL1 manufactured by Kaneka Corporation, an insulative film was formed on the board on which the VIA was formed. As a result, the insulative film having a film thickness of 500 nm was obtained. It was also confirmed that the upper side of the VIA formed by inkjet printing was not covered with the insulative film.

Subsequently, by screen printing using a conductive silver paste for screen printing, a conductive film was formed on the board on which the insulative film was formed. As a result, extraction of the electrode was enabled. The surface energy of the VIA was 28 mN/m when the present ink was drop-casted on the glass board to form a film and the film was measured in terms of the surface energy by the contact angle measuring method.

Example 2

First, a wiring pattern using a silver electrode was provided on a glass board by reverse printing to form an array.

Next, a conductor composition ink is printed on a desired point on a surface of the wiring pattern by inkjet printing to form a VIA, the conductor composition ink being a mixture of silver nano-colloids (average particle diameter: 40 nm), 2,3,5,6-tetrafluoro-4-(trifluoromethyl)benzenethiol and 1,3-propanediol at a mass ratio of 15:1:84. The VIA had a diameter of 30 μm and a height of 620 nm. As a result of a measurement using the probe-type step profiler, the VIA had a cross section having a substantially flat upper surface although having a gentle convex at the center of the upper surface.

Subsequently, by spin coating using ANL1 manufactured by Kaneka Corporation, an insulative film was formed on the board on which the VIA was formed. As a result, the insulative film having a film thickness of 500 nm was obtained. It was also confirmed that the upper side of the VIA formed by inkjet printing was not covered with the insulative film.

Subsequently, by screen printing using a conductive silver paste for screen printing, a conductive film was formed on the board on which the insulative film was formed. As a result, extraction of the electrode was enabled. The surface energy of the VIA was 20 mN/m when the present ink was drop-casted on the glass board to form a film and the film was measured in terms of the surface energy by the contact angle measuring method.

Comparative 1

First, a wiring pattern using a silver electrode was provided on a glass board by reverse printing.

Next, a commercially available silver nano-ink (Aldrich: 736503-25G) was printed at a desired point on a surface of the wiring pattern by inkjet printing to form a VIA. The VIA had a diameter of 50 μm and a height of 520 nm.

Subsequently, by spin coating using ANL1 manufactured by Kaneka Corporation, an insulative film was formed on the board on which the VIA was formed. As a result, the insulative film having a film thickness of 500 nm was obtained. However, since an upper side of the VIA formed by inkjet printing was not liquid-repellent, the VIA was entirely covered with the insulative film to block electrical connection. The surface energy of the VIA was 40 mN/m when the present ink was drop-casted on the glass board to form a film and the film was measured in terms of the surface energy by the contact angle measuring method.

The invention claimed is:

1. A conductor composition ink consisting of:
   (A) a fluorine-containing compound to form a self-assembled monomolecular film;
   (B) metal particles;
   (C) a solvent; and
   optionally a dispersant,
   wherein:
     the content of component (A) is from 0.1 mass % to 10 mass % based on total mass of the ink;
     the content of component (B) is from 15 mass % to 50 mass % based on the total mass of the ink;
     the content of component (C) is from 50 mass % to 85 mass % based on the total mass of the ink; and
     the content of the dispersant is 10 mass % or less based on the total mass of the ink; and
     wherein a solidified film produced by drying and solidifying the conductor composition ink has a surface energy of from 20 mN/m to 30 mN/m.

2. The conductor composition ink according to claim 1, wherein the component (A) is a fluorine-containing thiol compound.

3. The conductor composition ink according to claim 1, wherein the component (A) forms a self-assembled monomolecular film on the metal particles of the component (B).

4. The conductor composition ink according to claim 1, wherein the solidified film comprises a surface energy in a range from 20 mN/m to 28 mN/m.

5. The conductor composition ink according to claim 1, wherein the component (A) is at least one compound selected from the group consisting of a fluorine-containing thiol compound having an aromatic ring and alkanethiol having a fluorinated moiety.

6. The conductor composition ink according to claim 1, wherein the component (A) is a fluorine-containing thiol compound having an aromatic ring and 6 to 20 carbon atoms.

7. The conductor composition ink according to claim 1, wherein the component (A) is at least one compound selected from the group consisting of 4-trifluoromethylbenzenethiol, 3-trifluoromethylbenzenethiol, pentafluorobenzenethiol, 2,3,5,6-tetrafluorobenzenethiol, 2,3,5,6-tetrafluoro-4-(trifluoromethyl)benzenethiol, 2,3,5,6-tetrafluoro-4-mercapto benzoic acid methylester, 3,5-bistrifluoromethylbenzenethiol, 4-fluorobenzenethiol, and 11-(2,3,4,5,6-pentafluorobenzyloxy)-1-undecanethiol.

8. The conductor composition ink according to claim 1, wherein the component (B) comprises at least one metal species selected from the group consisting of silver, copper, nickel, palladium, platinum, and gold.

9. The conductor composition ink according to claim 1, wherein the metal species of the component (B) is silver.

10. The conductor composition ink according to claim 1, wherein the component (C) is a diol solvent having a surface tension in a range from 40 mN/m to 65 mN/m.

11. The conductor composition ink according to claim 1, wherein the component (C) is at least selected one solvent selected from the group consisting of ethylene glycol, glycerin and 1,3-propanediol.

12. A conductor material in the form of a solidified film produced by drying and solidifying the conductor composition ink of claim 1.

13. A laminate comprising:
a board;
an electrode provided on the board; and
the conductor material in the form of a solidified film of claim 12.

14. The laminate according to claim 13, further comprising:
an insulative film that is formed on the board, the electrode and the conductor without covering an upper side of the conductor material.

15. The laminate according to claim 14, further comprising:
a further conductive film that is formed on the insulative film and is in contact with the upper side of the conductor material.

16. A laminated wiring board comprising the laminate according to claim 13.

17. An electronic equipment article comprising the laminated wiring board according to claim 16.

* * * * *